United States Patent [19]

Miura et al.

[11] Patent Number: 5,750,606
[45] Date of Patent: May 12, 1998

[54] AQUEOUS FLUORINE-CONTAINING POLYMER DISPERSION

[75] Inventors: Toshiro Miura; Yoshihiro Soda; Tadao Hayashi, all of Settsu, Japan

[73] Assignee: Daikin Industries, Ltd., Osaka, Japan

[21] Appl. No.: 776,521

[22] PCT Filed: Jul. 31, 1995

[86] PCT No.: PCT/JP95/01520

§ 371 Date: Feb. 3, 1997

§ 102(e) Date: Feb. 3, 1997

[87] PCT Pub. No.: WO96/04343

PCT Pub. Date: Feb. 15, 1996

[30] Foreign Application Priority Data

Aug. 4, 1994 [JP] Japan .................................. 6-183444

[51] Int. Cl.$^6$ .................................................. C08K 3/20
[52] U.S. Cl. ........................ 524/244; 524/100; 524/208; 524/255
[58] Field of Search .................................. 524/244, 100, 524/208, 255

[56] References Cited

U.S. PATENT DOCUMENTS 3,833,731  9/1974  Grier et al. .
4,655,815  4/1987  Jakubowski .
4,945,109  7/1990  Rayudu .

FOREIGN PATENT DOCUMENTS

| 51-17914 | 2/1976 | Japan . |
| 56-63902 | 5/1981 | Japan . |
| 61-24502 | 2/1986 | Japan . |
| 62-541 | 1/1987 | Japan . |
| 62-195304 | 8/1987 | Japan . |
| 2-59550 | 2/1990 | Japan . |
| 3-17002 | 1/1991 | Japan . |
| 4-33941 | 2/1992 | Japan . |
| 4-297401 | 10/1992 | Japan . |
| 6-24908 | 2/1994 | Japan . |
| 6-199607 | 7/1994 | Japan . |
| 6-228489 | 8/1994 | Japan . |

*Primary Examiner*—Joseph L. Schofer
*Assistant Examiner*—N. Sarofin
*Attorney, Agent, or Firm*—Armstrong, Westerman, Hattori, McLeland & Naughton

[57] ABSTRACT

An aqueous fluorine-containing polymer dispersion, which comprises a fluorine-containing polymer, a nonionic surfactant and a preservative having at least one halogen atom on a carbon atom having an electron attractive group or a preservative having methylol group or methylene group and releasing formaldehyde, is provided. The above-mentioned dispersion is free of putrefying odor and suspended matters, is excellent in stability for a long period of time without pH decrease and does not generate any cissing and aggregation at the time of coating such as impregnation.

8 Claims, No Drawings

AQUEOUS FLUORINE-CONTAINING POLYMER DISPERSION

TECHNICAL FIELDS

The present invention relates to an aqueous fluorine-containing polymer dispersion, and particularly relates to an aqueous fluorine-containing polymer dispersion comprising a fluorine-containing polymer, a nonionic surfactant and a preservative. An aqueous fluorine-containing polymer dispersion containing a polytetrafluoroethylene resin, which is one of the aqueous fluorine-containing polymer dispersions of the present invention, is coated on base materials, for instance, glass clothes, carbon fibers and the like and used suitably, for example, for a conveyor belt, an architectural fabric (sheet for an air dome), a packing, a printed circuit board for high frequency and the like.

BACKGROUND ARTS

Among aqueous fluorine-containing polymer dispersions, an aqueous polytetrafluoroethylene resin dispersion (hereinafter may be referred to as "PTFE dispersion" or "PD") is explained below as a representative example.

In order to obtain dispersion stability of PTFE primary particles in a PTFE dispersion, for example, nonionic surfactants such as poly(oxyethylene alkyl ether) represented by R—O—(CH$_2$CH$_2$O)$_n$H (wherein R is an alkyl group or an alkenyl group, n is an integer of 2 to 18) or poly(oxyethylene alkylphenyl ether) represented by

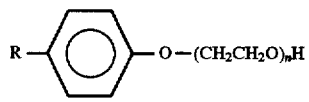

(wherein, R is an alkyl group or an alkenyl group, n is an integer of 2 to 18) have been hitherto mixed in an amount of, for instance, 3 to 10 parts by weight, preferably 5 to 8 parts by weight per 100 parts by weight of PTFE.

However the nonionic surfactants mixed in the above-mentioned PD are easy to become nutriments for microorganisms, for example, bacteria, mildews, yeasts and the like. Particularly in case of a temperature of not less than 30° C. in summer time, bacteria (air-borne bacteria) become remarkably active, and there occur malodor, brown suspended matters of dead bacteria and the like, which markedly lower product value.

In order to obtain dispersion stability of the PTFE primary particles, pH of the above-mentioned PD is adjusted at 9 to 11 by means of alkaline substances such as aqueous ammonia. However since the pH lowers to about 7 to about 8 due to the above-mentioned air-borne bacteria, stability of the PTFE primary particles in the PD lowers and aggregation is easy to occur.

Also the above-mentioned PD is impregnated in glass clothes, and used, for instance, for a sheet for an air dome, a printed circuit board, a conveyor belt and the like. During the impregnation work, however, the PD is contaminated with a sizing agent such as starch and the like being contained in the glass clothes, and such an agent becomes nutriments for bacteria. As a result, the PD used once for the impregnation becomes remarkably easy to be putrefied depending on storage conditions, and cannot be stored for a long period of time.

As properties required for a preservative for the above-mentioned PD, there are (1) Effective ingredients can be dissolved or dispersed in water in a desired amount, and no coloration shall occur when blending with the PD;

(2) The preservatives shall widely act on bacteria, mildews, yeasts and the like, and particularly antibacterial activity against Gram negative bacterium which is a main cause for putrefaction shall be high and an antibacterial effect shall be maintained for a long period of time (about 6 months).

(3) The preservatives shall be stable at a pH of 9 to 11.

(4) When admixed with the PD, the preservatives shall be stable at a temperature of not more than 50° C. and shall be decomposed quickly at a temperature of not less than 200° C., and no decomposed substances such as carbides shall remain at a temperature around a melting point of PTFE.

(5) The preservatives shall not make an adverse effect such as aggregation on the PD, and, when the PD is impregnated in fabrics such as glass clothes and carbon fibers, shall not cause undesired states such as cissing and aggregation on the fabrics.

The present circumstances are such that there has been reported no preservative for PD, which satisfies those properties, and that the PD mixed with the preservatives has not yet been obtained.

An object of the present invention is to provide an aqueous fluorine-containing dispersion which assures, by mixing a preservative to the above-mentioned PD, that the nonionic surfactants become difficult to be affected by the air-borne bacteria, no malodor and suspended matters occur, almost no pH decreasing occurs, there is an excellent long-term stability, no abnormality such as the cissing and aggregation is recognized at the time of the impregnation in, for example, glass clothes, carbon fibers and the like, and no putrefaction occurs for a long period of time even if a sizing agent and the like get mixed in the PD, and to provide a coated article prepared by coating a substrate with the above-mentioned dispersion and an impregnated article prepared by impregnating a porous article with the PD.

It is to be noted that the present invention is applicable to other aqueous fluorine-containing resin dispersions and aqueous fluorine-containing elastomer dispersions in addition to the above-mentioned aqueous polytetrafluoroethylene resin dispersion.

DISCLOSURE OF THE INVENTION

The present invention relates to an aqueous fluorine-containing polymer dispersion comprising a fluorine-containing polymer, a nonionic surfactant and a preservative.

It is preferable that the above-mentioned preservative is an organic compound having at least one halogen atom on a carbon atom having an electron attractive group.

Also the above-mentioned preservative is preferably an organic compound represented by the formula (I):

(wherein, X is a halogen atom, i.e., fluorine atom, chlorine atom, bromine atom or iodine atom, n is an integer of 1 to 3, R is an aliphatic organic group having 1 to 4 carbon atoms, A is an electron attractive group such as —CONH$_2$, —CN, —COCH$_3$, —COOH, —COOCH$_3$, —NO or —NO$_2$, a part of hydrogen atoms of the above R may be substituted by each of the above-mentioned halogen atom, the above-mentioned electron attractive group and a mixture thereof).

Also it is preferable that the above-mentioned preservative is an organic compound having methylol group or methylene group and releasing formaldehyde.

Also the above-mentioned preservative is preferably an organic compound represented by the formula (II):

R—NHCH₂OH (II)

(wherein, R is an aliphatic organic group having 1 to 4 carbon atoms, a part of hydrogen atoms of the above R may be substituted by each of =O, —OH, fluorine atom, chlorine atom, bromine atom, iodine atom and a mixture thereof).

Also it is preferable that the above-mentioned fluorine-containing polymer is a polytetrafluoroethylene resin.

Further the present invention relates to a coated article prepared by coating a substrate with the above-mentioned aqueous fluorine-containing polymer dispersion.

Still further the present invention relates to an impregnated article prepared by impregnating a porous article with the above-mentioned aqueous fluorine-containing polymer dispersion.

BEST EMBODIMENTS FOR CARRYING OUT THE INVENTION

As the fluorine-containing polymer used in the present invention, there are fluorine-containing resins represented by polytetrafluoroethylene (PTFE) and fluorine-containing elastomers represented by vinylidenefluoride-hexafluoropropylene type elastomers.

The above-mentioned fluorine-containing resins used in the present invention encompass, in addition to PTFE, for example, fluorine-containing polymers such as tetrafluoroethylene-perfluoro(alkyl vinyl ether) copolymer (PFA), tetrafluoroethylene-hexafluoropropylene copolymer (FEP), polyvinylidene fluoride (PVdF), ethylene-tetrafluoroethylene copolymer (ETFE) and ethylene-chlorotrifluoroethylene copolymer (ECTFE), and are widely applicable to aqueous fluorine-containing polymer dispersions. As the above-mentioned PTFE, those having, for instance, a melt viscosity of $1\times10^4$ to $1\times10^{11}$ poises, preferably $1\times10^8$ to $1\times10^{11}$ poises at 380° C. are suitably used.

The above-mentioned PTFE may be so-called a modified PTFE which is modified by a very small amount of hexafluoropropylene, perfluoro(alkyl vinyl ether), chlorotrifluoroethylene or the like.

Also as the fluorine-containing elastomers used in the present invention, in addition to the vinylidenefluoride-hexafluoropropylene type elastomers, there are, for example, vinylidenefluoride-type elastomers such as vinylidenefluoride-tetrafluoroethylene-hexafluoropropylene type elastomers and vinylidenefluoride-chlorotrifluoroethylene type elastomers, tetrafluoroethylene-propylene type elastomers, hexafluoropropylene-ethylene type elastomers, fluoro(alkyl vinyl ether) (including ones having a plurality of ester bonds)-olefine type elastomers, fluorophosphasen rubbers and the like. These fluorine-containing elastomers can be widely applied to aqueous fluorine-containing polymer dispersions which are required to be stabilized by using nonionic surfactants.

In the present invention, there is suitably used an aqueous fluorine-containing polymer dispersion wherein primary particles of the above-mentioned fluorine-containing polymer obtained by emulsion polymerization and the like are dispersed. Since the presence of the preservative inhibits activities of microorganisms, particularly air-borne bacteria and makes pH of the aqueous fluorine-containing polymer dispersion stable, there are neither aggregation nor putrefaction, and storage stability of the dispersion is enhanced.

In the present invention, nonionic surfactants are used for the purpose to obtain dispersion stability of the particles of the above-mentioned fluorine-containing polymers. As the nonionic surfactants, there are, for example, polyoxyethylene alkyl ethers, polyoxyethylene alkylphenyl ethers, polyoxyethylene fatty acid esters, sorbitan fatty acid esters, polyoxyethylene sorbitan fatty acid esters, glycerine esters, polyoxyethylene alkylamines, and derivatives thereof. More particularly, as the polyoxyethylene alkyl ethers, there are polyoxyethylene lauryl ether, polyoxyethylene cetyl ether, polyoxyethylene stearyl ether, polyoxyethylene oleyl ether, polyoxyethylene behenyl ether and the like; as the polyoxyethylene alkylphenyl ethers, there are polyoxyethylene nonylphenyl ether, polyoxyethylene octylphenyl ether and the like; as the polyoxyethylene fatty acid esters, there are polyoxyethylene monolauric acid ester, polyoxyethylene monooleic acid ester, polyoxyethylene monostearic ester and the like; as the sorbitan fatty acid esters, there are sorbitan monolauric acid ester, sorbitan monopalmitic acid ester, sorbitan monostearic acid ester, sorbitan monooleic acid ester and the like; as the polyoxyethylene sorbitan fatty acid esters, there are polyoxyethylene sorbitan monolauric acid ester, polyoxyethylene sorbitan monopalmitic acid ester, polyoxyethylene sorbitan monostearic acid ester and the like; and as the glycerine esters, there are monomyristic acid glyceryl, monostearic acid glyceryl, monooleic acid glyceryl and the like. Also as the derivatives thereof, there are, for example, polyoxyethylene alkylphenyl-formaldehyde condensates, polyoxyethylene alkyl ether phosphoric acid salts and the like. Among these surfactants, preferable is polyoxyethylene alkylphenyl ethers, and further preferable are polyoxyethylene nonylphenyl ether and polyoxyethylene octylphenyl ether.

As the preservative used in the present invention, there are suitably used an organic compound having at least one halogen atom on a carbon atom having an electron attractive group, or an organic compound having methylol group or methylene group and releasing formaldehyde.

As the above-mentioned organic compound having at least one halogen atom on a carbon atom having an electron attractive group, there are, for example, ones represented by the formula (I):

$X_n$—R—A (I)

(wherein, X is a halogen atom, i.e., fluorine atom, chlorine atom, bromine atom or iodine atom, n is an integer of 1 to 3, R is an aliphatic organic group having 1 to 4 carbon atoms, A is an electron attractive group, e.g., —CONH₂, —CN, —COCH₃, —COOH, —COOCH₃, —NO or —NO₂, a part of hydrogen atoms of the above R may be substituted by each of the above-mentioned halogen atom, the above-mentioned electron attractive group and a mixture thereof).

Examples of the organic compounds represented by the above-mentioned formula (I) are, for example, ICH₂CONH₂, ClCH₂CONH₂, FCH₂CONH₂, Cl₂CHCONH₂, BrCH₂CBr(CN)CH₂CH₂CN, ClCH₂CONHCH₂OH and the like, and ICH₂CONH₂ and BrCH₂CBr(CN)CH₂CH₂CN are preferable from the viewpoint of stability before or after the addition and from a point that they are easy to obtain.

As the above-mentioned organic compounds having methylol group or methylene group and releasing formaldehyde, there are, for example, ones represented by the formula (II):

R—NHCH$_2$OH  (II)

(wherein, R is an aliphatic organic group having 1 to 4 carbon atoms, a part of hydrogen atoms of the above R may be substituted by each of =O, —OH, fluorine atom, chlorine atom, bromine atom, iodine atom and a mixture thereof).

Examples of the organic compounds represented by the above-mentioned formula (II) are, for example, ClCH$_2$CONHCH$_2$OH, HOCH$_2$CH$_2$NHCH$_2$OH, HOCH$_2$C(CH$_3$)$_2$NHCH$_2$OH and the like.

Also as the preservative of the present invention, there can be suitably used a compound represented by

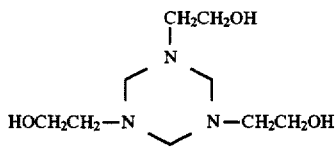

in addition to those represented by the formulae (I) and (II).

The concentration of the fluorine-containing polymer in the aqueous fluorine-containing polymer dispersion of the present invention is from 10 to 75% (% by weight, hereinafter the same), preferably from 40 to 60%.

The amount of the nonionic surfactants used in the present invention is from 3 to 10 parts (part by weight, hereinafter the same), preferably from 5 to 8 parts per 100 parts of the above-mentioned fluorine-containing polymer.

The content of the preservative used in the present invention is from 1 to 10,000 ppm, preferably from 10 to 1,000 ppm, more preferably from 50 to 500 ppm in the aqueous fluorine-containing polymer dispersion. If the content of the preservatives is less than 1 ppm, there is a tendency that a long-term antibacterial effect cannot be obtained, and if more than 10,000 ppm, there is a tendency that toxicity of the dispersion become higher resulting in difficulty in drain treatment and further the PD is colored by the preservatives.

In the aqueous fluorine-containing polymer dispersion of the present invention, there can be mixed additives complying with various uses in an amount of 0.1 to 40 parts per 100 parts of the dispersion. Examples of the additives are, for instance, fillers such as glass, talc, mica, clay, SiO$_2$, TiO$_2$, Al$_2$O$_3$ and ceramic compounds; colorants such as organic and inorganic pigments; thickeners such as methyl cellulose; paint additives such as leveling agents and the like.

Also the aqueous fluorine-containing polymer dispersion of the present invention can be used alone and may be diluted with various solvents, for example, N,N-dimethylformamide, N,N-dimethylacetamide, N-methyl-2-pyrrolidone, dimethyl sulfoxide, methyl ethyl ketone, methylglycol acetate, 2-nitropropane, ethyleneglycol acetate, toluene and the like.

In the present invention, for instance, in case where a temperature is one where the preservatives are not decomposed (not more than 50° C. ), it is preferable that the preservatives are added to the PD as earlier as possible. The reason of this is that as mentioned above, the putrefaction of the nonionic surfactants is mainly caused by the air-borne bacteria and the above-mentioned preservatives have an antibacterial activity but not a sterilizing activity.

Also since the preservatives in the present invention are an organic compound having a relatively low molecular weight as mentioned above, if they are added to the above-mentioned alkaline PD, they are easily decomposed at a temperature of not less than 50° C. and there is a possibility that there occurs coloring of the aqueous fluorine-containing polymer dispersion. Thus it is preferable that the preservatives are added at a temperature lower than 50° C. Stirring the dispersion relatively slowly for about 30 to 60 minutes is enough because as the preservatives, a compound having a good water-solubility or dispersibility with water is selected.

Subsequently the aqueous fluorine-containing polymer dispersion of the present invention is explained more particularly based on Examples, but the present invention is not limited thereto.

EXAMPLE 1

An aqueous fluorine-containing polymer dispersion of the present invention was prepared by adding 1.0 g of 2-iodoacetamide (aqueous solution containing 10% of active ingredient) as a preservative to 1 kg of an aqueous PTFE dispersion (product of Daikin Industries, Ltd., trade name: Daikin Polyflon Dispersion D-2, resin solid content 60%, nonionic surfactant 6% (per a polymer)) with stirring at 25° C. and fully dispersing over 5 minutes. Then the following tests were carried out by using the obtained dispersion.

The tests were conducted in the manner as mentioned below. In these tests, there were used aqueous fluorine-containing polymer dispersions just after produced and also ones having been allowed to stand outdoors in a sealed vessel for six months after produced.

Antibacterial property 1. 300 ml of pure water, 1.5 g of agar and 10.5 g of agar medium are poured in Erlenmeyer flask.

2. 0.9 ml of pure water is poured in a test tube by using a micropipette and a silicone plug is put in the test tube.

3. The flask charged with the agar and the pure water-filled test tube are sterilized in an autoclave at 120° C.×2 atm for 15 minutes. After about 40 minutes, a pressure is reduced to an atmospheric pressure.

4. The Erlenmeyer flask charged with the agar and the sterilized water filled-test tube are taken out from the autoclave and put in a safety cabinet. Subsequently a necessary number of clean and dry petri dishes are put in the safety cabinet, followed by irradiation of ultraviolet light for about 15 minutes.

The petri dishes to be used are those dried at 150° C. for 3 hours by a dryer. The agar is poured into the dishes in the safety cabinet, and after the agar becomes solid, a cover is turned upside down. A tip and a sample are not put in the safety cabinet.

5. The tip and sample are put in the safety cabinet, and 0.1 μl of the aqueous fluorine-containing polymer dispersion is disseminated into the agar base.

The tip to be used is one sterilized.

6. A spreader having been soaked in ethanol is sterilized by a gas burner and cooled, and then the agar base is spread by using the spreader. In this case the spreader is to be cooled sufficiently.

7. The agar base is put in a constant temperature room at 30° C., and allowed to stand for about 2 days.

8. About 2 days later, the agar base is taken out, and the number of bacteria is measured (The unit of the number of bacterium is shown by cfu/ml).

Odor from putrefying

A sensory test was made and evaluated. When there is putrefying odor, it is evaluated as "Present" and when there is no putrefying odor, it is evaluated as "None."

Suspended matters

Suspended matters were visually checked. When there are suspended matters, it is evaluated as "Present", and when no suspended matters are found, it is evaluated as "None."

Dispersion stability

Dispersion stability was checked visually. When there are aggregates found, it is evaluated as "Aggregates found", and when no aggregate is found, it is evaluated as "Good."

pH pH was measured in accordance with JIS K-6893.

Specific gravity

Specific gravity was measured in accordance with JIS.K-6893.

Viscosity

Viscosity was measured in accordance with JIS K-6893.

Cissing and aggregation at the time of coating

An aqueous fluorine-containing polymer dispersion or PD is impregnated in 0.5 mm thick glass cloth which is then scraped with a doctor bar to remove the excess aqueous dispersion therefrom. After dried at 100° C., the glass cloth was baked in an electric oven at 380° C. for 3 minutes. These operations were repeated 3 times. The coated conditions were visually observed and evaluated. When there are cissing and aggregation, it is evaluated as "Present", and when no cissing and aggregation is found, it is evaluated as "None."

The results are shown in Table 1.

EXAMPLE 4

An aqueous fluorine-containing polymer dispersion of the present invention was prepared in the same manner as in Example 1 except that as a preservative, there was used N,N',N"-trishydroxyethylhexahydro-S-triazine in an amount of 600 ppm as an active ingredient amount (0.6 g) based on an aqueous PTFE dispersion, and the same tests as in Example 1 were carried out. The results are shown in Table 1.

COMPARATIVE EXAMPLE 1

With respect to the aqueous PTFE dispersion (produced by Daikin Industries, Ltd., trade name Daikin Polyflon Dispersion D-2) used in Example 1, tests were carried out in the same manner as in Example 1.

The results are shown in Table 1.

TABLE 1

| Example No. | 1 | 2 | 3 | 4 | Com.Ex.1 |
|---|---|---|---|---|---|
| Mixing amount (solid content) Preservative | | | | | |
| 2-iodoacetamide (ppm) | 100 | — | — | — | — |
| 1,2-dibromo-2,4-dicyanobutane (ppm) | — | 100 | — | — | — |
| 2-(hydroxymethylamino)-2-methyl-1-propanol (ppm) | — | — | 150 | — | — |
| N,N',N"-trishydroxyethylhexahydro-S-triazine (ppm) | — | — | — | 600 | — |
| PTFE (% by weight) | 60 | 60 | 60 | 60 | 60 |
| Nonionic surfactants (% by weight) | 6%/PTFE | 6%/PTFE | 6%/PTFE | 6%/PTFE | 6%/PTFE |
| Tests | | | | | |
| Antibacterial property (cfu/ml) | 0→0 | 0→0 | 0→0 | 0→0 | 0→6.7 × $10^7$ |
| Odor | None→None | None→None | None→None | None→None | None→Present |
| Suspended matters | None→None | None→None | None→None | None→None | None→Present |
| Dispersion stability | Good→Good | Good→Good | Good→Good | Good→Good | Good→Aggregates found |
| pH | 9.2→9.2 | 9.2→9.2 | 9.2→9.2 | 9.2→9.2 | 9.2→7.4 |
| Specific gravity | 1.520→1.520 | 1.520→1.520 | 1.520→1.520 | 1.520→1.520 | 1.520→1.520 |
| Viscosity (cP) | 21.5→21.5 | 21.5→21.5 | 21.5→21.5 | 21.5→21.5 | 21.5→21.5 |
| Cissing and aggregation at the time of coating | None | None | None | None | None |

EXAMPLE 2

An aqueous fluorine-containing polymer dispersion of the present invention was prepared in the same manner as in Example 1 except that as a preservative, there was added 0.4 g of 1,2-dibromo-2,4-dicyanobutane (aqueous solution containing 25% of active ingredient). There were carried out the tests in the same manner as in Example 1 by using the above-mentioned dispersion. The results are shown in Table 1.

EXAMPLE 3

An aqueous fluorine-containing polymer dispersion of the present invention was prepared in the same manner as in Example 1 except that as a preservative, there was used 2-(hydroxymethylamino)-2-methyl-1-propanol in an amount of 150 ppm as an active ingredient amount (0.15 g) based on an aqueous PTFE dispersion, and the same tests as in Example 1 were carried out. The results are shown in Table 1.

INDUSTRIAL APPLICABILITY

As it is clear from Table 1, since the aqueous fluorine-containing polymer dispersion of the present invention is less affected by air-borne bacterium, no putrefying odor and suspended matter are generated, almost no pH decrease occurs, the dispersion is stable for a long period of time, no cissing and aggregation occur at the time of coating such as impregnation in a glass cloth, and there remains, on an impregnated fabric, no substance resulting from decomposition of a preservative. Thus there can be provided a coated article prepared by coating a substrate with the above-mentioned aqueous fluorine-containing polymer dispersion and an impregnated article prepared by impregnating a porous article with the above-mentioned dispersion. The aqueous fluorine-containing polymer dispersion can be suitably used for conveyor belts, architectural fabric (sheet for an air dome), packings, printed circuit boards for high frequency and the like.

We claim:

1. An aqueous polytetrafluoroethylene dispersion comprising polytetrafluoroelthylene, a nonionic surfactant and a preservative selected from the group consisting of 2-iodoacetamide, 1,2-dibromo-2,4-dicyanobutane, 2-(hydroxymethylamino)-2-methyl-1-propanol and N,N', N"-trishydroxyethylhexahydro-S-triazine.

2. The aqueous polytetrafluoroethylene dispersion of claim 1, wherein the preservative is 2-iodoacetamide.

3. The aqueous polytetrafluoroethylene dispersion of claim 1, wherein the preservative is 1,2-dibromo-2,4-dicyanobutane.

4. The aqueous polytetrafluoroethylene dispersion of claim 1, wherein the preservative is 2-(hydroxymethylamino)-2-methyl-1-propanol.

5. The aqueous polytetrafluoroethylene dispersion of claim 1, wherein the preservative is N,N',N"-trishydroxyethylhexahydro-S-triazine.

6. A coated article prepared by coating a substrate with the aqueous polytetrafluoroethylene dispersion of claim 1.

7. An impregnated article prepared by impregnating a porous article with the aqueous polytetrafluoroethylene dispersion of claim 1.

8. The impregnated article of claim 1, wherein the porous article is a glass cloth.

* * * * *